United States Patent [19]

Rust

[11] Patent Number: 4,912,468

[45] Date of Patent: Mar. 27, 1990

[54] NON-LINEAR ERROR CORRECTION SYSTEM

[75] Inventor: Gregory J. Rust, Arlington, Mass.

[73] Assignee: Dynamics Research Corporation, Wilmington, Mass.

[21] Appl. No.: 129,872

[22] Filed: Dec. 4, 1987

Related U.S. Application Data

[63] Continuation of Ser. No. 805,336, Dec. 4, 1985, abandoned.

[51] Int. Cl.⁴ .............................................. H03M 1/06
[52] U.S. Cl. .................................. 341/119; 341/118; 364/571.03; 364/571.04; 364/571.07
[58] Field of Search ........ 340/347 P, 347 M, 347 CC, 340/347 CY, 658; 250/231 SE; 328/155; 341/118, 119, 155, 156, 141, 157; 331/66, 176; 364/557, 571.01, 571.03

[56] References Cited

U.S. PATENT DOCUMENTS

| | | | |
|---|---|---|---|
| 3,537,099 | 10/1970 | Johansson | 340/347 CC |
| 3,790,910 | 2/1974 | McCormack | 364/573 |
| 4,070,665 | 1/1978 | Glennon et al. | 340/347 SY |
| 4,489,551 | 12/1984 | Watanabe et al. | 4127/63 |
| 4,584,601 | 4/1986 | Suzuki et al. | 358/80 |
| 4,592,002 | 5/1986 | Bozarth et al. | 341/119 |
| 4,602,515 | 7/1986 | Eichenlaub | 364/506 |
| 4,631,520 | 12/1986 | Wingate | 341/119 |

OTHER PUBLICATIONS

Kennedy, Calibration of Analog Channels, IBM Technical Disclosure Bulletin, vol. 16, No. 9, 2/1974, p. 2771.

Primary Examiner—William M. Shoop, Jr.
Assistant Examiner—Brian K. Young
Attorney, Agent, or Firm—Weingarten, Schurgin, Gagnebin & Hayes

[57] ABSTRACT

A compensation system for a position encoder which automatically compensates for scale and other similar errors along the entire path of relative motion. The phase of the encoder signals is altered by a small amount for each small increment of relative motion to provide encoder signals compensated for the scale error. The phase correction is added to or substracted from the phase of the encoder signals depending upon the sense of relative motion.

5 Claims, 2 Drawing Sheets

NON-LINEAR ERROR CORRECTION SYSTEM

This application is a continuation of application Ser. No. 6/805336, filed Dec. 4, 1985, now abandoned.

FIELD OF THE INVENTION

The invention relates to position encoders and transducers and more particularly to apparatus and techniques for compensation of scale and similar errors.

BACKGROUND OF THE INVENTION

Electro-optical incremental encoders of transducers are known for measurement of linear or rotary motion or position. Such encoders include a scale of alternately light responsive and opaque segments which is cooperative with an optical head to provide an optical pattern representative of the motion of the head relative to the scale. Electrical signals derived from the optical pattern represent the relative motion, and these signals are usually processed to produce a digital count indicative of the distance the head travels relative to the scale. Scale errors, such as variations in the width and spacing of the scale segments, can cause errors in the measurement of the distance along the intended path. These errors can be caused by imprecise printing, scribing or other formation of segments on the scale, as well as by variations caused by temperature changes of the scale during operation. Such errors can become significant especially in high resolution encoders in which a high density optical pattern is provided on the encoder scale.

Scale error has been treated heretofore by adjustment in the encoder electronics to add or subtract counts as predetermined intervals of distance along the scale to alter proportionally the total count in order to minimize the error component. One method of treating scale adjustment is shown in copending U.S. patent application Ser. No. 618,509, filed on June 8, 1984 by Sidney A. Wingate, the inventor named therein, entitled: "POSITION ENCODER COMPENSATION SYSTEM," and assigned to the assignee of the present invention. In said system, depicted in FIG. 1 herein, the position encoder is automatically compensated for scale and other similar errors by altering the phase of the encoder signal by a small amount for each small increment of relative motion. The encoder provides an electrical output of four sine wave signals, $+S$, $-S$, $+C$ and $-C$, which are complementary pairs of sine waves with phases displaced by 90°. The signals are applied to a displacement counter 12 operative to provide an output signal for each predetermined amount of movement of the encoder head relative to the encoder scale. The displacement counter 12 provides an increment output pulse for relative motion in one direction, and a decrement output pulse for relative motion in the opposite direction. A preset input to counter 12 is provided by control 14, which provides the displacement increment for which counter 12 will provide an output. The input of control 14 is derived from a measurement of the scale error, and this input is used to determine the amount of relative movement for which a correction output is to be provided. The displacement counter 12 drives counter and switching logic which provide the requisite phase correction to the encoder signals. The output of counter 12 is applied via a reversing switch 16 to a phase control counter 18, which provides a multiple bit digital signal representative of the number of displacement increments traversed by the encoder scale relative to the head. The output of counter 18 controls the operation of quadrant switches 20 and 22 and multiple switches 28 and 30 to accomplish the desired phase correction, via resistor networks 24 and 26. The phase compensated encoder signals are then employed as the encoder output for display or other utilization purposes.

SUMMARY OF THE INVENTION

In brief, the present invention provides a compensation system for a position encoder or transducer which automatically compensates for scale and other similar errors along the entire path of relative motion in a way that is transparent to the end user. The invention employs the compensation technique of the aforesaid copending patent application in an improved system in which scale error is stored in a digital memory, which may be part of a microprocessor, and which can be readily changed and recalled for use. The system error can be stored as a plot of the transducer position versus the true position as supplied by a laser interferometer, for example. The stored system plot is reduced to a format usable for automatic phase compensation and embodied typically in a look-up array or table of scale error versus transducer position. As the transducer moves from one position to another position, the error value for the interval between those two positions is compared with the accumulated position, and correction to the input transducer signals is made by a requisite phase correction to the encoder signals. The phase compensated encoder signals are then employed as the encoder output for display or other utilization purposes. Usually, the encoder signals prior to utilization are applied to cycle interpolation logic which, as is known, is operative to increase the resolution of the encoder output signals.

The invention is useful for any linear or rotary encoder or transducer which provides sine wave signals representing input motion, and compensation can be provided for any repeatable phase error function. In general, a representation of the error function is digitally stored, and a phase correction is applied by the appropriate shifting of the phase of the encoder signals in accordance with the stored error function.

Thermal compensation for temperature induced scale errors is also made possible with the present invention, by measuring the thermal change of the scale from an equilibrium point, and adjusting the error correction curve to compensate for temperature variations.

DESCRIPTION OF THE DRAWINGS

The invention will be more fully understood from the following detailed description taken in conjunction with the drawings in which.

DETAILED DESCRIPTION OF THE INVENTION

In the preferred embodiment, the invention is employed with a linear encoder which includes an elongated scale disposed along a path to be monitored, and an electro-optical head which is mounted for movement relative to the scale and which provides electrical signals representative of relative motion or position along the travel path. In a typical installation, the head is fixed to a machine tool or other apparatus, while the scale is attached to a moveable element for motion forward and backward along the length of the scale. The encoder output is usually a measure of the distance travelled by the scale along the head with respect to a reference position, and is often in the form of a numerical display indicative of distance. The encoder outut signals can also be employed in a control system for automatic control of machine elements and the like.

Figure 1:
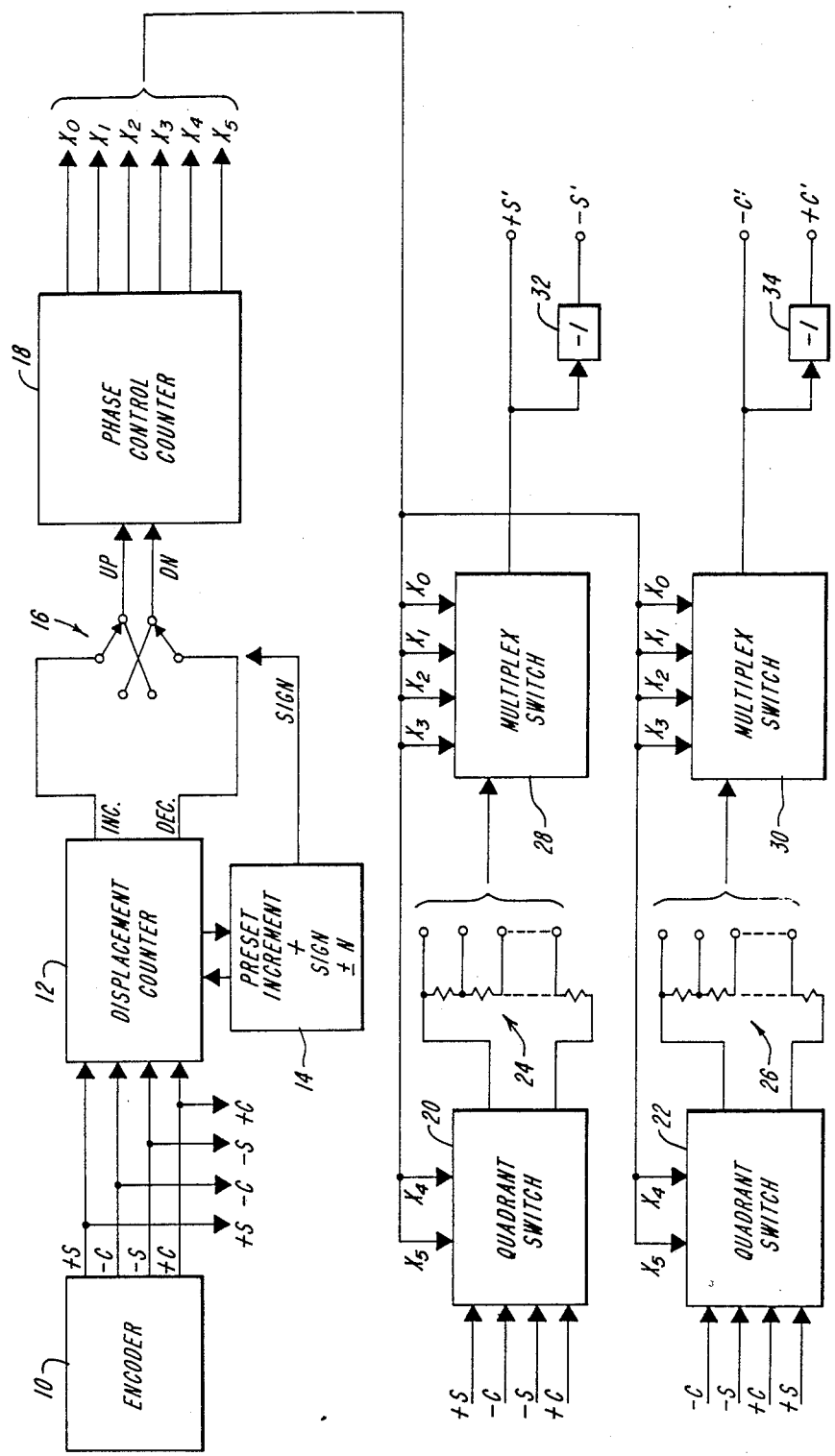
FIG. 1 is a block diagram of a previously known error compensation system.
Figure 2:
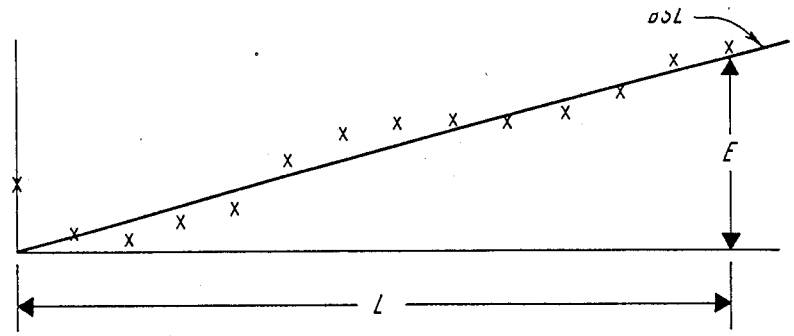
FIG. 2 is a typical error plot for a linear encoder scale including a best straight line approximation of the measured error points.

The linear encoder scale has errors which can result in corresponding errors in output measurement. The scale errors are caused by variations in the widths and/or spacing of the light responsive segments, which variations are caused by errors or variations in the manufacture of the scale, thermal expansion and contraction of the scale during use, or bending of the scale in an installed position. A typical error plot for a linear encoder scale is illustrated in FIG. 2. A succession of measurement points are plotted along a scale length L. A best straight line (BSL) is fitted to the measured points to provide a straight line error function having a slope E/L. The BSL error function is a good approximation of the actual error and is advantageous in its simplicity of utilization in the novel compensation system of the present invention. The invention, however, is not limited to this particular error function, as the invention can also be implemented for use with other error functions which may be desirable in specific instances. In the preferred embodiment of the present invention, the non-linear error correction "image" of the system error plot is stored in a microprocessor. There are several possible means by which this non-linear error correction can be determined, including: (1) a laser position versus encoder position profile supplied by the end user; (2) a series of linear incremental corrections that represent the system profile; or (3) a high-order polynomial description of the system profile.

Figure 3:
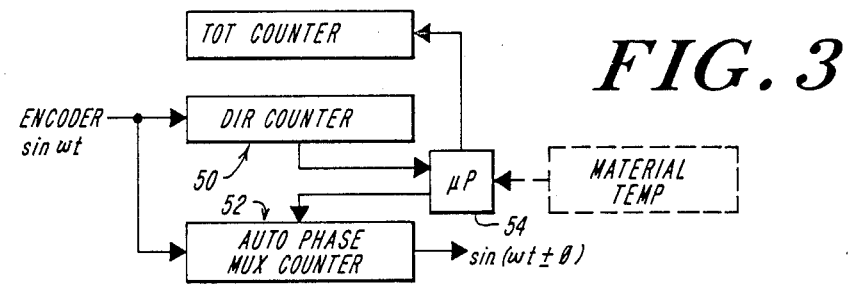
FIG. 3 is a block diagram of one embodiment of the error compensation system in accordance with the invention.

A system embodying the present invention is shown in block diagram form in FIG. 3. After the system is initialized by setting all the counters and presets to zero, an encoder provides an electrical output of a sine wave signal to a direction counter 50 and to an autophase mux counter 52. Data is read from the microprocessor 54 and placed into the autophase mux counter 52. This data contains the magnitude and sign of the error function. For a positive slope of the error curve, there is a positive sign bit; for a negative slope, there is a negative sign bit. The data also contains the step length, which establishes the predetermined movement of the encoder scale relative to the encoder head necessary to produce an output correction pulse.

During operation, the system enters into an automatic looping mode. The direction counter 50 is polled. When the direction coutner 50 shows that a predetermined movement of the encoder scale relative to the head has been achieved, the direction counter 50 provides to a microprocessor 54 an increment or a decrement pulse, in accordance with and determined by the sense of motion of the encoder scale. The data read from the microprocessor 54 will depend on the direction of the encoder scale relative to the head. If there is a positive slope, the subsequent data is read; if there is a negative slope, the previous data is read. The microprocessor 54 thus provides digital data displacement distance (slope) representative of the number of displacement increments traversed by the encoder scale relative to the head, which is input into the autophase mux counter 52 and is used to correct the phase of the encoder signal. In the preferred embodiment, this digital data is kept by means of two digital words. One word contains information relating to the correction to be provided to the sine wave signals. The second word contains information relating to the length of the travel path over which the correction can be provided. Of course, there is no requirement that the data be provided via two digital words, and the form of the data can take various forms well-known to one of ordinary skill.

The output signal from the autophase mux counter 52 is the compensated encoder signal. After a totaling counter 56 and the direction counter 50 are updated, the system returns to the beginning of the loop and the procedure repeats. The totaling counter 56 keeps track of the total displacement of the encoder scale relative to the head.

Thermal or material compensation adjustment may also be accomplished with the preferred embodiment, by adjusting the slope component of the control word based on a measured temperature or measured variation in physical shape. Additional correction tables can be generated, containing the corrected slope. The temperature input is then used to index and select the correction table with the properly corrected slope.

Figure 4:
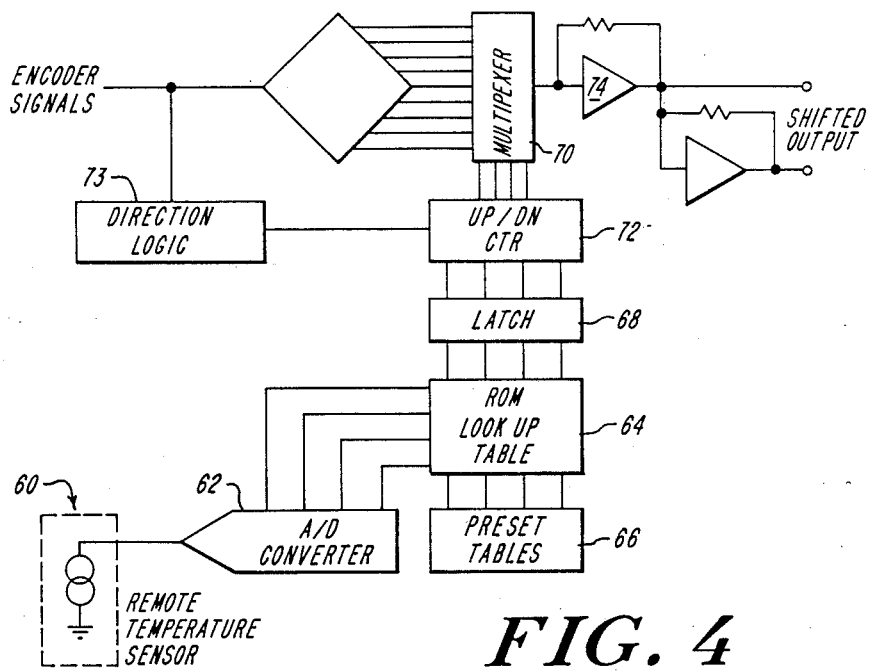
FIG. 4 is a block diagram of a particular embodiment of the compensation system for measuring temperature compensation.

FIG. 4 shows a system embodying the present invention which uses a measured temperature to generate a correction table to shift the phase of the encoder output signal. The correction signal is digitally stored in this embodiment in a Read-only Memory (ROM) 64. A temperature sensor 60 and A/D converter 62 present a digital word, or address, to the ROM 64. The ROM 64 has as a further input a digital word provided by the preset switch 66. Switch 66 provides to the ROM 64 a constant that represents the linear slope correction factor for a given scale at some reference temperature (e.g., 68° F.).

Preset switch 66 can comprise a set of switches with a single correction scale preset onto them, or can comprise a table which can be selectively activated to output to the ROM 64 any one of several correction scale. The A/D converter 62 provides ROM 64 with a word which may be either linear or non-linear depending on the characteristics of the input sensor 60. Depending on the temperature reading input to the ROM 64 via converter 62, and further depending on the scale provided to the ROM 64 via table 66, the ROM 64 outputs a digital word representative of the shift which must be made to the encoder signal. The word from the ROM 64 look-up table is shifted by means of a latch 68 connected to a multiplexer 70 by an up/down counter 72. The multiplexer 70 produces the compensated signal, which then goes through an inverter 74, which produces positive and negative signals. The latch 68 is used to control the data input to the up/down counter 72. One approach is to use a zero reference pulse to act as a read, or update, pulse.

The temperature compensation technique described herein leaves the phase adjustment transparent to the end user. Also, the amount of engineering work needed on a circuit board would be reduced from that needed for a hard-wired analog embodiment.

The invention is not to be limited to that which has been particularly shown and described, except as indicated in the appended claims.

What is claimed is:

1. For use with a position encoder having a scale and a head movable relative to the scale, and providing encoder signals presenting the position of the head relative to the scale, a system for compensating for a scale error comprising:
   a sensor means for sensing variations in temperature;
   means for coverting sensed temperature variations from said sensor means to a digital signal;
   a ROM look-up table for storing a correction signal;
   a digital table which can be selectively activated to provide said ROM look-up table a correction signal representative of a correction factor for a predetermined reference temperature;
   multiplexer means for adjusting said encoder signals with said correction signal as a function of temperature to produce an encoder signal adjusted for temperature variations.

2. A signal compensating system comprising:
   an encoder output signal to be corrected;
   a temperature sensor means;
   means for converting a signal from said sensor into a digital signal;
   a ROM look-up table for storing a correction table;
   means for generating a particular correction signal from a digital storage means in response to said sensor; and
   a multiplexer receiving the encoder signal output and correction signal and operative to provide a corrected signal.

3. A signal compensating system comprising:
   an electrical output signal from an encoder;
   a multiplexer which receives said electrical output signal;
   a digital ROM look-up table for storing predetermined error correction data;
   a temperature sensor;
   means operative in response to said sensor for providing predetermined error correction data from said digital ROM look-up table to said multiplexer to correct said electrical output signal with said error correction data to provide a compensated signal.

4. A signal compensating system providing an error correction signal including:
   first digital means for storing predetermined error correction data;
   means coupled to a means for sensing temperature to produce a digital signal corresponding to temperature; and
   second digital means for using said digital signal corresponding to temperature to access said predetermined error correction data, and to provide an outut signal indicative thereof;
   means for providing an encoder signal including direction logic means for receiving a signal from an encoder and determining the direction of motion; and
   third digital means for compensating said signal from said encoder, including fourth digital means for multiplexing said encoder signal with said output signal indicative of said predetermined error correction data;
   wherein said output signal indicative of said predetermined error correction data is coupled to said fourth digital means for multiplexing by fifth digital means for latching and sixth digital means for up/down counting.

5. Apparatus for compensating an encoder signal for temperature variations, comprising:
   a multiplexer with one input coupled to a digital representation of an encoder signal and a second input coupled to digital means for providing correction information;
   a digital look-up table which uses a digital signal representative of temperature to access predetermined error correction data stored in digital memory means and provide an output indicative thereof; and
   up/down counter and latch means coupling said second input of said multiplexer to said output of said digital look-up table.

* * * * *